United States Patent
Chen et al.

(10) Patent No.: US 10,027,342 B1
(45) Date of Patent: Jul. 17, 2018

(54) PIPELINED ANALOG-TO-DIGITAL CONVERTER AND OPERATING METHOD THEREOF

(71) Applicant: REALTEK SEMICONDUCTOR CORPORATION

(72) Inventors: Chih-Lung Chen, Hsinchu County (TW); Chi-Ying Lee, Taipei (TW); Kuo-Sheng Chung, Taipei (TW); Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/711,776

(22) Filed: Sep. 21, 2017

(30) Foreign Application Priority Data

Jan. 16, 2017 (TW) .............................. 106101453 A

(51) Int. Cl.
  *H03M 1/12* (2006.01)
  *H03M 1/16* (2006.01)
  *H03M 1/74* (2006.01)

(52) U.S. Cl.
  CPC ............ *H03M 1/167* (2013.01); *H03M 1/74* (2013.01)

(58) Field of Classification Search
  CPC ................................. H03M 1/167; H03M 1/74
  USPC ......................................................... 341/144
  See application file for complete search history.

(56) References Cited

U.S. PATENT DOCUMENTS

| | | | | |
|---|---|---|---|---|
| 6,489,904 B1 * | 12/2002 | Hisano | ................ | H03M 1/1061 341/120 |
| 6,822,601 B1 * | 11/2004 | Liu | ..................... | H03M 1/1004 341/120 |
| 6,963,300 B1 * | 11/2005 | Lee | ..................... | H03M 1/1245 341/162 |
| 7,221,191 B2 | 5/2007 | Ali et al. | | |

(Continued)

OTHER PUBLICATIONS

Hyun H. Boo et al., "A 12b 250 MS/s Pipelined ADC With Virtual Ground Reference Buffers" IEEE Journal of Solid-State Circuits, vol. 50, No. 12, Dec. 2015.

(Continued)

*Primary Examiner* — Lam T Mai
(74) *Attorney, Agent, or Firm* — WPAT, PC

(57) ABSTRACT

A pipelined analog-to-digital converter (ADC) and an operating method are provided. The pipelined ADC includes a multiplying digital-to-analog converter (MDAC) and a sub-ADC. The MDAC alternatively operates in an amplifying phase and a sampling phase according to two non-overlapping clocks, and performs operations on an input signal in the amplifying phase according to a target voltage determined by a digital code. The sub-ADC includes multiple comparators, a determination circuit, and an encoding circuit. The comparators generate multiple comparison results by comparing the input signal with multiple predetermined voltages. The determination circuit generates multiple comparison completion signals in a non-overlapping interval of the two clocks according to the comparison results. The comparison completion signals respectively indicate whether the comparators complete the comparison. The encoding circuit determines the digital code according to the comparison results and the comparison completion signals.

8 Claims, 11 Drawing Sheets

(56) References Cited

U.S. PATENT DOCUMENTS

| | | | | |
|---|---|---|---|---|
| 8,451,160 B1* | 5/2013 | Zhou | .................... | H03M 1/1215 |
| | | | | 341/155 |
| 8,502,713 B1* | 8/2013 | Lin | ..................... | H03M 1/0607 |
| | | | | 341/118 |
| 8,648,913 B2* | 2/2014 | Deng | .................. | H03M 1/0641 |
| | | | | 348/161 |
| 2002/0014982 A1* | 2/2002 | Jonsson | .............. | H03M 1/1057 |
| | | | | 341/120 |
| 2004/0125008 A1* | 7/2004 | Yamaji | .................. | H03M 1/007 |
| | | | | 341/155 |
| 2013/0257637 A1* | 10/2013 | Gotoh | ....................... | H03F 3/04 |
| | | | | 341/155 |
| 2014/0062736 A1* | 3/2014 | Nandi | ................. | H03M 1/0675 |
| | | | | 341/110 |

OTHER PUBLICATIONS

Rohan Sehgal et al., "A 12 b 53 mW 195 MS/s Pipeline ADC with 82 dB SFDR Using Split-ADC Calibration" IEEE Journal of Solid-State Circuits, vol. 50, No. 7, Jul. 2015.

* cited by examiner

PIPELINED ANALOG-TO-DIGITAL CONVERTER AND OPERATING METHOD THEREOF

BACKGROUND

1. Field of the Disclosure

The present disclosure generally relates to analog-to-digital converters (ADCs), and, more particularly, to pipelined ADCs (also called pipeline ADCs).

2. Description of Related Art

FIG. 1 is a conventional pipelined analog-to-digital converter (ADC) 100 comprising a plurality of serially connected operation stages 110, a terminal ADC 120, and a digital correction circuit 130. The input signal $V_{in}$ is subjected to multi-stage operations of comparison, subtraction, and amplification, and finally the correction circuit 130 generates a digital code D by correcting the output of each operation stage 110 and the output of the terminal ADC 120. The digital code D is the result of analog-to-digital conversion of the input signal $V_{in}$. The operating principles of the pipelined ADC 100 are well known to those of ordinary skill in the art and shall be omitted herein for brevity.

The operation stage 110 includes a sub-ADC 200 (as shown in FIG. 2) and a multiplying digital-to-analog converter (MDAC) 300 (as shown in FIG. 3), both operating according to two clocks $\Phi_1$ and $\Phi_2$ that do not overlap (i.e., being non-overlapping) (as shown in FIG. 4). If the circuit operates (e.g., turning on switches) at high levels of the clock, then "non-overlapping" means that the two clocks are not at high levels at the same time. More specifically, the intervals between time points t1 and t2 and time points t1' and t2' shown in FIG. 4 are non-overlapping intervals of the two clocks. The sub-ADC 200, which can be applied to a 1.5-bit pipelined ADC, includes comparators 220, 240 and an encoding circuit 260. The comparator 220 and the comparator 240 compare the differential input signal $V_{in}$ (including the signal $V_{in}^+$ and the signal $V_{in}^-$) with a first predetermined voltage ($V_{ref}/4$) and a second predetermined voltage ($-V_{ref}/4$) ($V_{ref}$ being a reference voltage), and respectively generates a set of comparison results (signals d0 and d0_b being one set, and signals d1 and d1_b being another set). The encoding circuit 260 encodes the two sets of comparison results to generate a digital code CV that contains three bits CVp, CVm, CVn. The encoding circuit 260, formed by a plurality of logic gates (e.g., six AND gates 262 to 267), outputs the digital code CV according to the clock $\Phi_2$. More specifically, the sub-ADC 200 conducts comparison and encoding when the clock $\Phi_1$ is high, and the encoding circuit 260 outputs the digital code CV when the clock $\Phi_2$ is high. In other words, the bits CVp, CVm and CVn are determined when the clock $\Phi_2$ switches from a low level to a high level, and are all logic 0 before they are determined.

The MDAC 300 shown in FIG. 3 mainly includes an operational amplifier 310 that amplifies signals. The inverting input terminal of the operational amplifier 310 is coupled to the capacitors C0a and C1a through the switch S4a, and the non-inverting input terminal of the operational amplifier 310 is coupled to the capacitors C0b and C1b through the switch S4b. The MDAC 300 alternately operates in a sampling phase and an amplification phase according to the clocks $\Phi_1$ and $\Phi_2$. Taking the inverting input terminal of the operational amplifier 310 for example, in the sampling phase (the clock $\Phi_1$ being high) when the switches S0a, S1a, and S2a are turned on while the switches S3a, S4a, and S5a are turned off the capacitors C0a and C1a samples the signal $V_{in}^+$; in the amplification phase (the clock $\Phi_2$ being high) when the switches S0a, S1a, and S2a are turned off while the switches S3a, S4a, and S5a are turned on, the capacitor C0a becomes a feedback capacitor, and the MDAC 300 performs subtraction and multiplication operations on the input signal $V_{in}$ and outputs the differential output signal $V_{out}$ (including the signal $V_{out}^+$ and the signal V) as an input of the next operation stage. Similar operations apply to the non-inverting input of the operational amplifier 310 and shall be omitted herein for brevity. The voltage $V_{cm}$ in FIG. 3 is the common mode voltage of the differential input signal $V_{in}$. The values of the voltages $V_{R+}$ and $V_{R-}$ are determined by the digital code CV of the sub-ADC 200.

It should be noted that, when the amplification phase starts (i.e., at the time the clock $\Phi_2$ transitioning from the low level to the high level, the switches S3a to S5a and S3b to S5b turned on, and at the meantime the sub-ADC 200 outputting the digital code CV), the voltages at one end of the capacitors C1a and C1b change instantaneously. The instantaneous voltage change may probably cause disturbances in the voltages on the capacitors C1a and C1b. These voltage disturbances cause unexpected voltage fluctuations at the inputs of the operational amplifier 310 via the switches S4a and S4b, which in turn cause the output voltages of the operational amplifier 310 in an extremely unstable state. As a result, the MDAC 300 needs a longer response time to ensure stability. A longer response time, however, means that the pipelined ADC has a slower response speed, or that the pipelined ADC needs a greater driving current to operate at the same response speed.

SUMMARY OF THE DISCLOSURE

In view of the issues of the prior art, an object of the present disclosure is to provide a pipelined analog-to-digital converter (ADC) and its operating method, so as to improve the response speed and/or to reduce the power consumption of the pipelined ADC.

A pipelined ADC including a plurality of operation stages is provided. One of the operation stages includes a multiplying digital-to-analog converter (MDAC) and a sub-ADC. The MDAC alternately operates in an amplification phase and a sampling phase in accordance with a first clock and a second clock that do not overlap, and performs subtraction and multiplication operations on an input signal according to a target voltage determined by a digital code in the amplification phase. The sub-ADC is coupled to the MDAC and includes multiple comparators, a determination circuit and an encoding circuit. The comparators compare the input signal with a plurality of predetermined voltages and generate multiple comparison results accordingly. The determination circuit, which is coupled to the comparators, generates multiple comparison completion signals according to the comparison results in a non-overlapping interval of the first clock and the second clock. The comparison completion signals indicate whether the comparators have completed the comparison. The encoding circuit, which is coupled to the comparators and the determination circuit, determines the digital code according to the comparison results and the comparison completion signals.

A pipelined ADC including multiple operation stages is also provided. One of the operation stages includes a sub-ADC and an MDAC. The sub-ADC converts an input signal into a digital code and generates multiple comparison completion signals. All or a part of the comparison completion signals indicate whether a bit of the digit code has been determined. The MDAC, which is coupled to the sub-ADC, alternately operates in an amplification phase and a sampling phase in accordance with a first clock and a second clock that do not overlap. The MDAC includes an operational amplifier and a capacitor. The capacitor has a first end coupled to the operational amplifier and a second end coupled to the input signal. In a non-overlapping interval of the first clock and the second clock, the second end of the capacitor is coupled to a target voltage corresponding to the bit according to at least one of the comparison completion signals.

A method for operating a pipelined ADC is also provided. The pipelined ADC includes multiple operation stages, one of which includes an MDAC alternately operating in an amplification phase and a sampling phase. The method includes steps of: comparing an input signal with multiple predetermined voltages to generate multiple comparison results; generating multiple comparison completion signals according to the comparison results, wherein all or a part of the comparison completion signals indicate whether a bit of a digital code has been determined; determining the digital code according to the comparison results and the comparison completion signals; inputting the input signal to the MDAC in the sampling phase; and coupling the MDAC to a target voltage corresponding to the bit according to at least one of the comparison completion signals before the amplification phase that immediately follows the sampling phase starts.

The pipelined ADC and its operating method mitigate voltage disturbances or prevent the multiplying digital-to-analog converter (MDAC) from being subjected to voltage disturbances during the amplification phase by coupling the capacitors of the MDAC to a target voltage in advance before the beginning of the amplification phase. In this way, the MDAC only requires a shorter response time or a lower driving current, thus improving the response speed and/or reducing power consumption of the pipelined ADC.

These and other objectives of the present disclosure no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events. A pipelined analog-to-digital converter (ADC) and an operating method thereof are disclosed. The operating method can be performed by the pipelined ADC or equivalents of the pipelined ADC.

Figure 5:
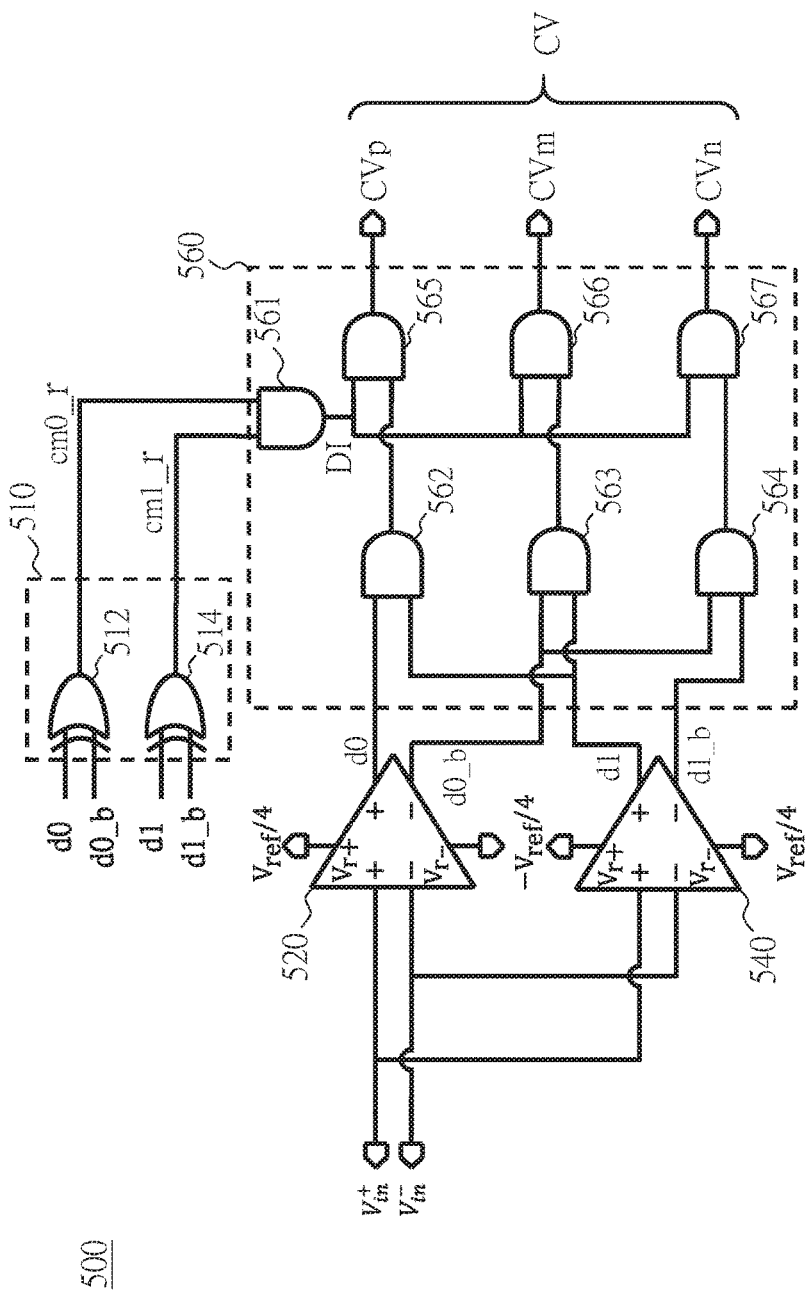
FIG. 5 illustrates a circuit diagram of a sub-ADC of an operation stage of a pipelined ADC according to an embodiment of this disclosure.

FIG. 5 is a circuit diagram of a sub-ADC of an operation stage of a pipelined ADC. The sub-ADC 500, which can be applied to a 1.5-bit pipelined ADC, includes a determination circuit 510, comparators 520, 540 and an encoding circuit 560. The operations of the comparators 520 and 540 are the same as those of the comparators 220 and 240 and thus the descriptions thereof shall be omitted herein for brevity. Based on the outputs of the comparators 520 and 540, the determination circuit 510 generates the comparison completion signals cm0_r and cm1_r indicating that the comparators 520 and 540 have completed the comparison. More specifically, before the comparator 520 completes the comparison, the output values d0 and d0_b are signals with the same logic value (both logic 0 or logic 1). After the comparison is completed, the output values d0 and d0_b are signals with different logic values (one being logic 0, the other being logic 1). The comparator 540 has similar operations. The determination circuit 510 may use the logic gates 512, 514 to determine whether the comparators 520 and 540 have completed the comparisons. In one embodiment, the logic gates 512 and 514 may be implemented by exclusive-OR (XOR) gates, but the implementation of the determination circuit 510 is not limited thereto. In the embodiment of FIG. 5, logic 1 of the comparison completion signal cm0_r (or cm1_r) stands for the completion of the comparison of the comparator 520 (or 540).

The encoding circuit 560 generates a digital code CV (including three bits CVp, CVm and CVn) by encoding the outputs d0, d0_b, d1, d1_b of the comparators 520 and 540. The encoding circuit 560 is implemented by seven gates 561 to 567, and the connections among these gates are shown in the figure. However, the implementation of the encoding circuit 560 is not limited to the embodiment of FIG. 5. The logic value of the bit CVp is associated with the comparison results d0 and d1, the logic value of the bit CVm is associated with the comparison results d0_b and d1, and the logic value of the bit CVn is associated with the comparison results d0_b and d1_b. That is, as soon as the comparators 520 and 540 complete the comparison, the digital code CV is determined. The indication signal DI is an intersection (i.e., AND operation, implemented by an AND gate 561) of the comparison completion signals cm0_r and cm1_r, and an input of each of the AND gates 565 to 567 is coupled to the indication signal DI. When the indication signal DI is logic 0 (i.e., when the comparator(s) 520 and/or 540 has (have) not yet completed the comparison), the digital code CV is in a standby state or a reset state where its three bits are all logic 0. When the indication signal DI is logic 1 (i.e., when both comparators 520 and 540 have completed the comparison), the digital code CV is determined (i.e., exiting the standby state or the reset state). Since the non-overlapping intervals of the clocks $\Phi_1$ and $\Phi_2$ are usually designed to be large enough to ensure that the comparators 520 and 540 complete the comparison before the amplification phase of the MDAC begins, the indication signal DI is generated or has a logic level transition in the non-overlapping intervals (i.e., before the beginning of the amplification phase).

Figure 1:
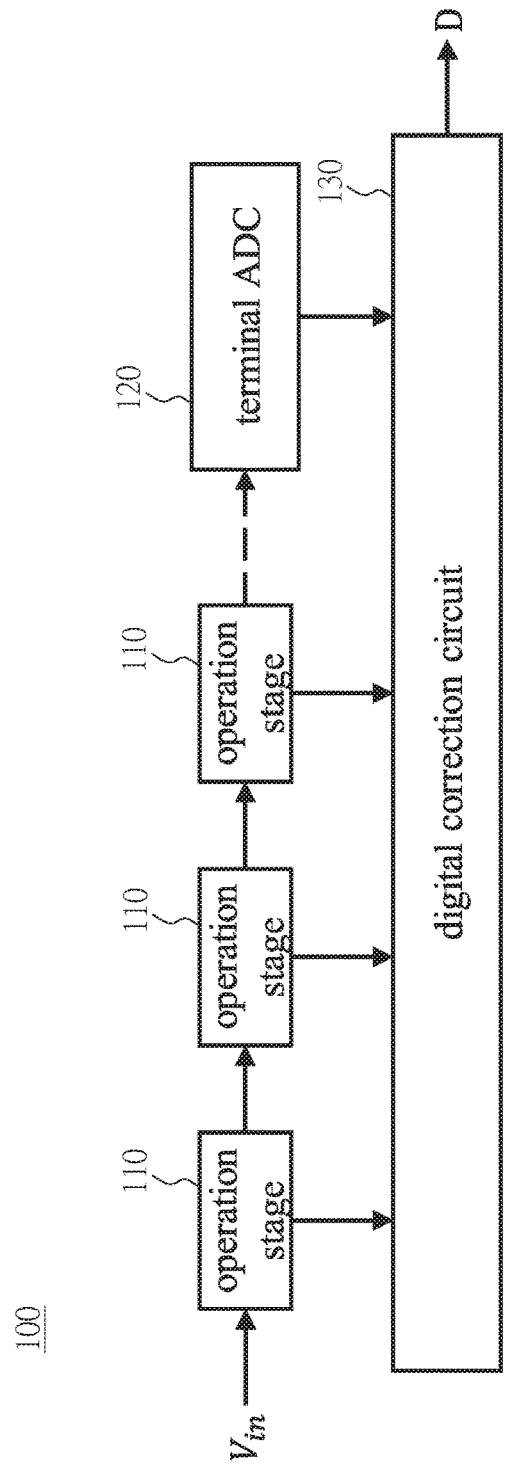
FIG. 1 illustrates a conventional pipelined analog-to-digital converter (ADC).
Figure 2:
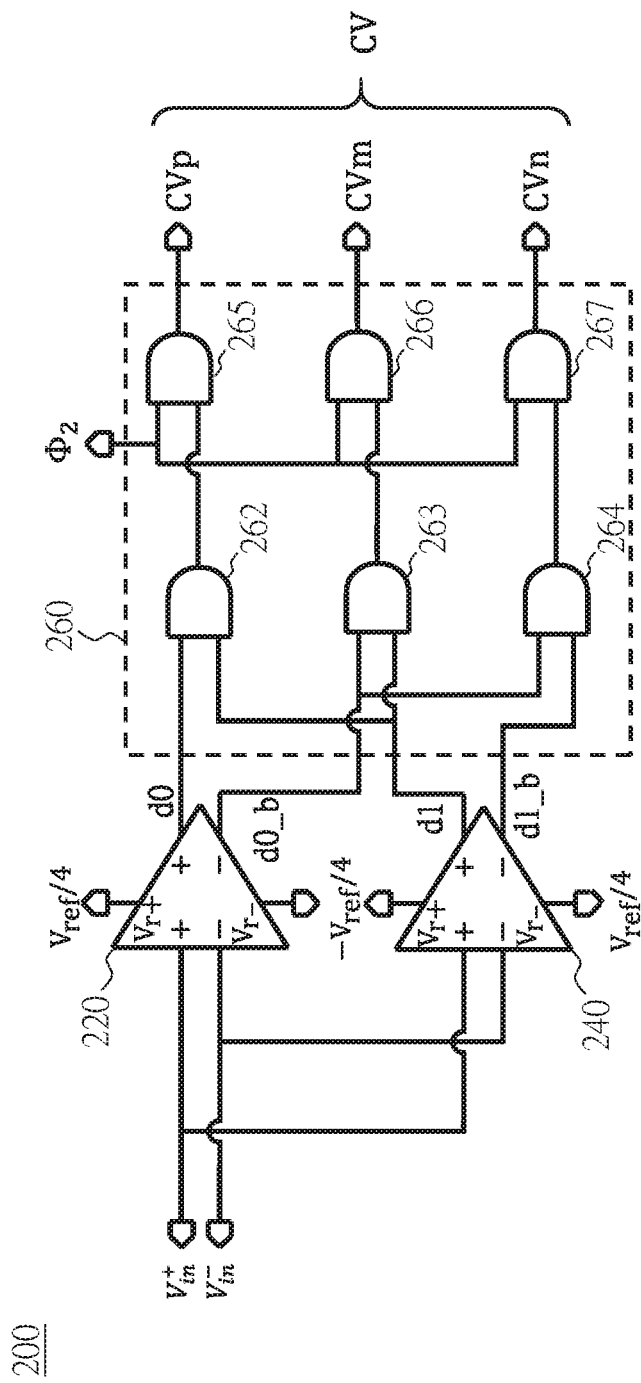
FIG. 2 illustrates a sub ADC.
Figure 3:
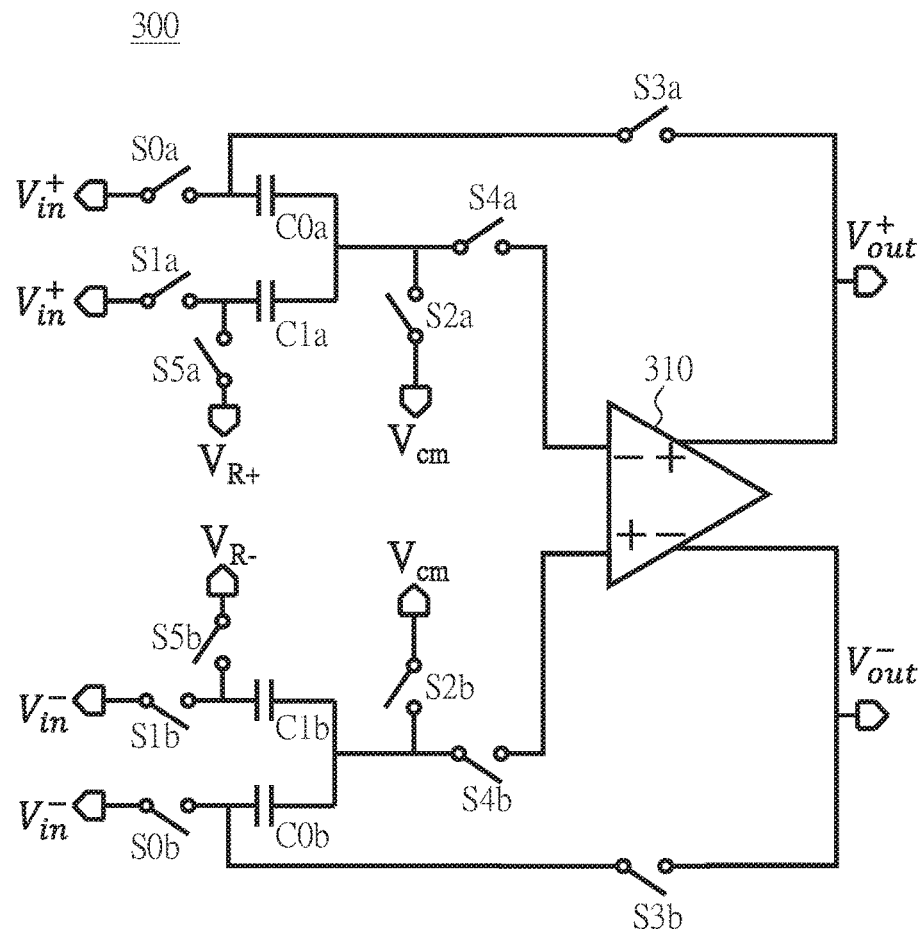
FIG. 3 illustrates a conventional multiplying digital-to-analog converter (MDAC).
Figure 4:
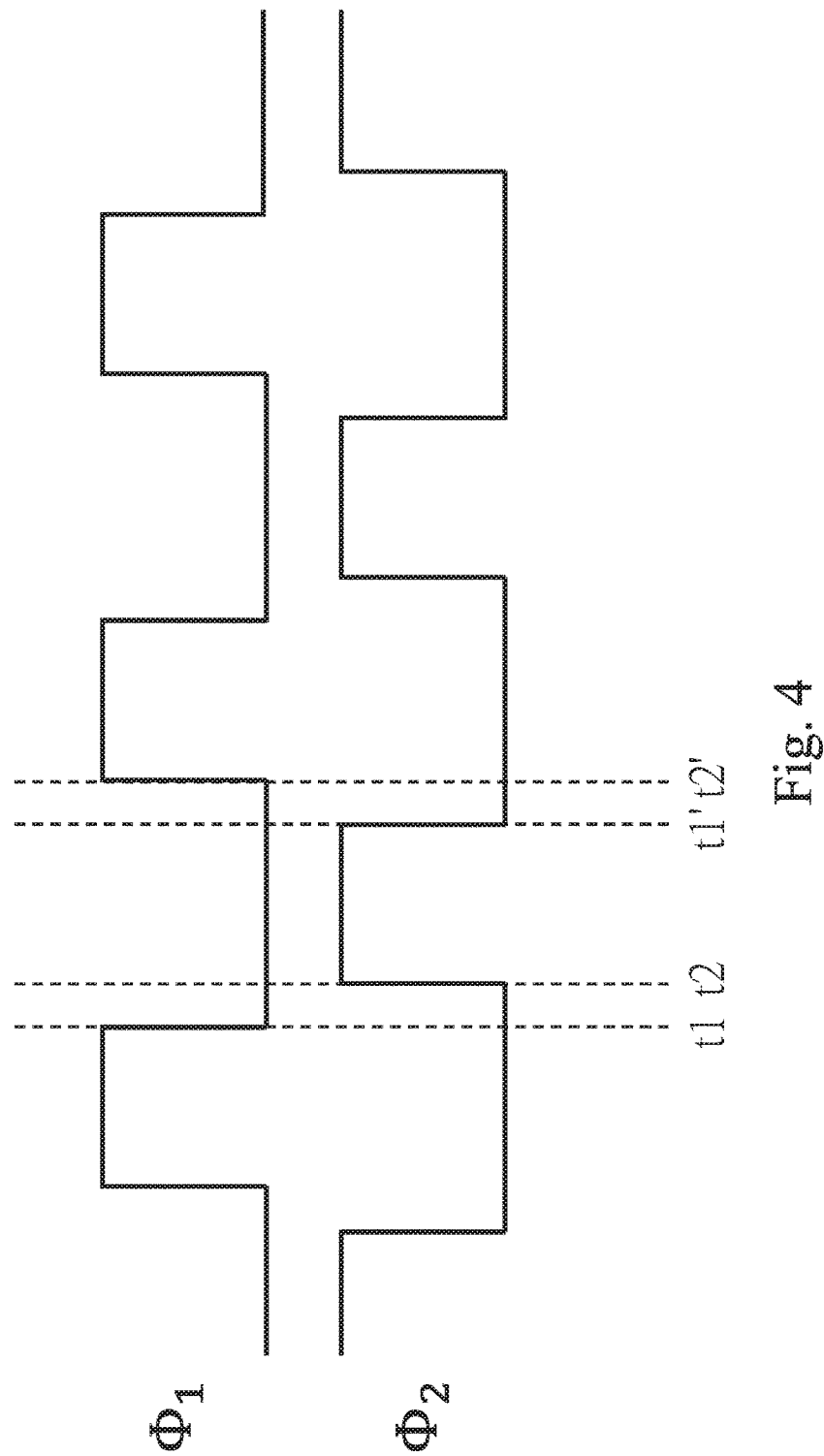
FIG. 4 illustrates two clocks $\Phi_1$ and $\Phi_2$ that do not overlap.
Figure 6A:
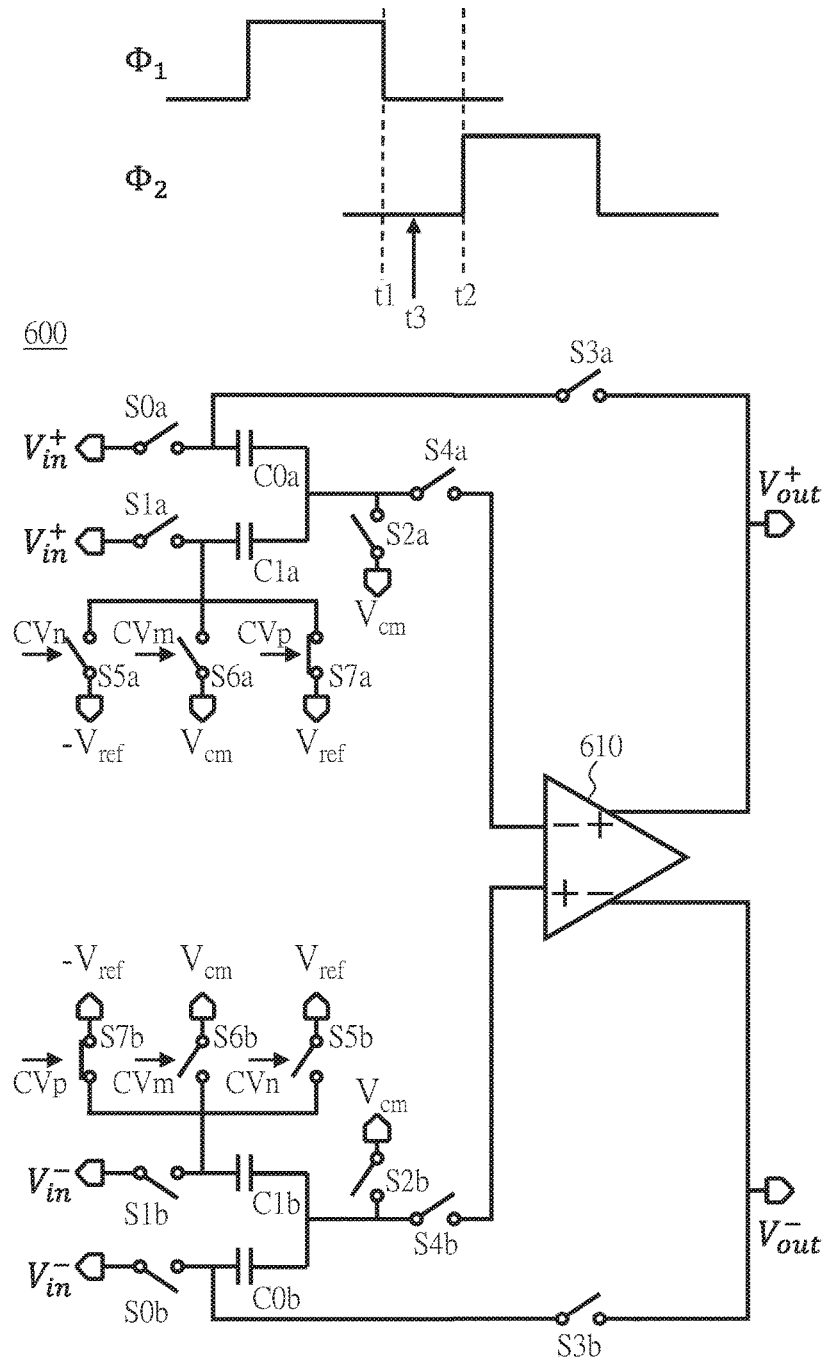
FIG. 6A illustrates a circuit diagram of the MDAC operating in a non-overlapping interval according to an embodiment of this disclosure.

FIG. 6A shows a circuit diagram of the MDAC operating in a non-overlapping interval according to an embodiment of this disclosure. The MDAC 600 mainly includes an operational amplifier 610 that amplifies signals, capacitors C0a, C1a, C0b, C1b, and switches S0a to S7a and S0b to S7b. The operations of the operational amplifier 610, the four capacitors and the switches S0a to S4a and S0b to S4b are similar to those of the MDAC 300 of FIG. 3, and thus omitted herein for brevity. As shown in the timing diagram in the upper portion of FIG. 6A, time point t3, located between time points t1 and t2 (i.e., located in the non-overlapping interval of the clocks $\Phi_1$ and $\Phi_2$), is the time point at which the indication signal DI has a logic level transition. The circuit diagram in the lower portion of FIG. 6A shows an example of the MDAC 600 corresponding to time point t3. As can be seen from the figure, the switches S5a to S7a and the switches S5b to S7b can be turned on or off according to the digital code CV at time point t3. In other words, the capacitors C1a and C1b are coupled to the target voltage (one of the voltages $V_{ref}$, $-V_{ref}$ and $V_{cm}$) in advance prior to the beginning of the amplification phase (i.e., time point t2) of the MDAC 600, which causes the voltages on the capacitors C1a and C1b to settle (i.e., to become substantially stable) in advance before the amplification phase begins. As an example, when the bits CVp, CVm, and CVn are respectively logics 1, 0, and 0, the switches S7a and S7b of FIG. 6A are turned on, causing the ends of the capacitors C1a and C1b (which are originally coupled to the input signal $V_{in}$ in the sampling phase) to be respectively coupled to the voltage $V_{ref}$ and the voltage $-V_{ref}$ at time point t3.

Figure 6B:
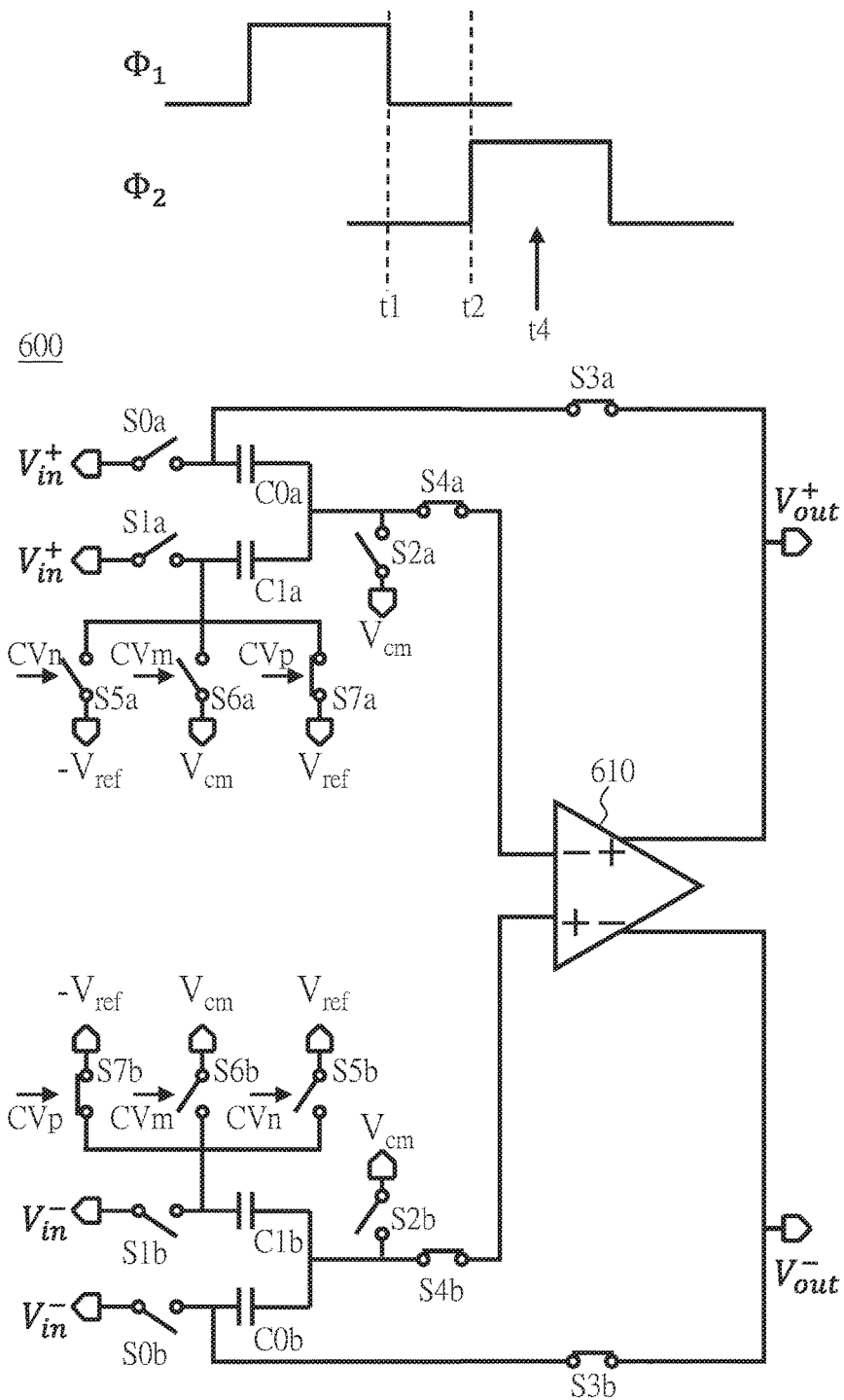
FIG. 6B illustrates a circuit diagram of the MDAC operating in an amplification phase according to an embodiment of this disclosure.

FIG. 6B shows a circuit diagram of the MDAC operating in the amplification phase (i.e., when the clock $\Phi_2$ is at high level such as time point t4 in the upper timing diagram) according to an embodiment of this disclosure. As can be seen from the figure, the switches S3a, S4a, S3b, S4b are turned on, and the switches S7a and S7b are still turned on. Since the target voltage is inputted to the MDAC 600 in advance before the beginning of the amplification phase (time point t2), i.e., the capacitors C1a and C1b are coupled to the target voltage(s) in advance before the beginning of the amplification phase, there is sufficient time for the voltages on the capacitors C1a and C1b to settle, which mitigates voltage disturbances or prevents the MDAC 600 from being subjected to voltage disturbances during the amplification phase. Such a circuit design shortens the response time of the MDAC 600, thereby increasing the speed of the pipelined ADC.

Figure 7:
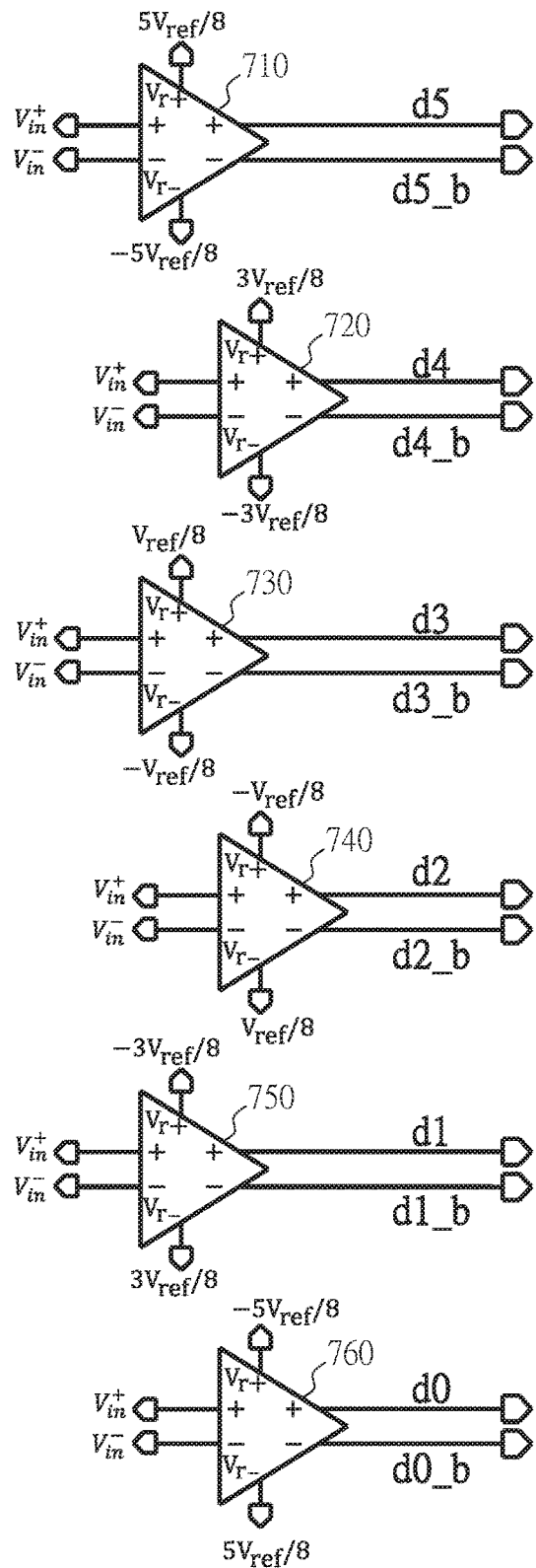
FIG. 7 illustrates multiple comparators of a sub-ADC of an operation stage of a 2.5-bit pipelined ADC.
Figure 8:
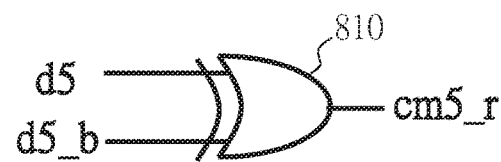
FIG. 8 illustrates a determination circuit of a sub-ADC of an operation stage of a 2.5-bit pipelined ADC.
Figure 8:
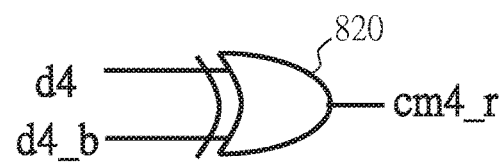
Figure 8:
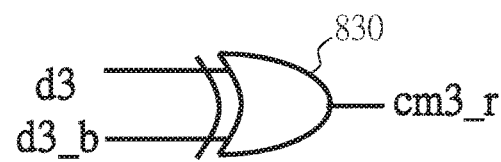
Figure 8:
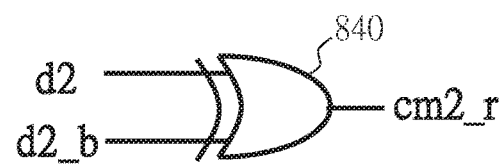
Figure 8:
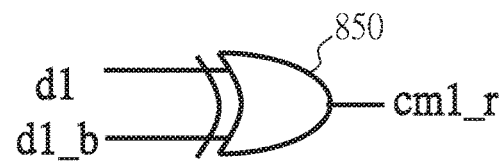
Figure 8:
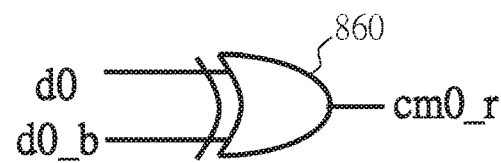

The foregoing embodiment is exemplified by a 1.5-bit pipelined ADC, but this disclosure is also applicable to higher-order pipelined ADCs. In the case of a 2.5-bit pipelined ADC, multiple comparators of a sub-ADC of an operation stage of the 2.5-bit pipelined ADC are shown in FIG. 7. The comparators 710 to 760 respectively compare the input signal $V_{in}$ with the voltages $5V_{ref}/8$, $3V_{ref}/8$, $V/8$, $-V_{ref}/8$, $-3V_{ref}/8$, $-5V_{ref}/8$, and each comparator outputs two comparison results dx and dx_b (x being 5 to 0). FIG. 8 shows a determination circuit of a sub-ADC of an operation stage of a 2.5-bit pipelined ADC. The exclusive-OR (XOR) gates 810 to 860 respectively output the comparison completion signals cm5_r to cm0_r, which respectively indicate whether the comparators 710 to 760 have completed the comparison. Since the non-overlapping interval of the clocks $\Phi_1$ and $\Phi_2$ is generally designed to be large enough to ensure that the comparators 710 to 760 complete the comparison before the beginning of the amplification phase of the MDAC, the comparison completion signals cm5_r to cm0_r are generated or have logic level transitions in the non-overlapping interval (i.e., before the beginning of the amplification phase).

Figure 9:
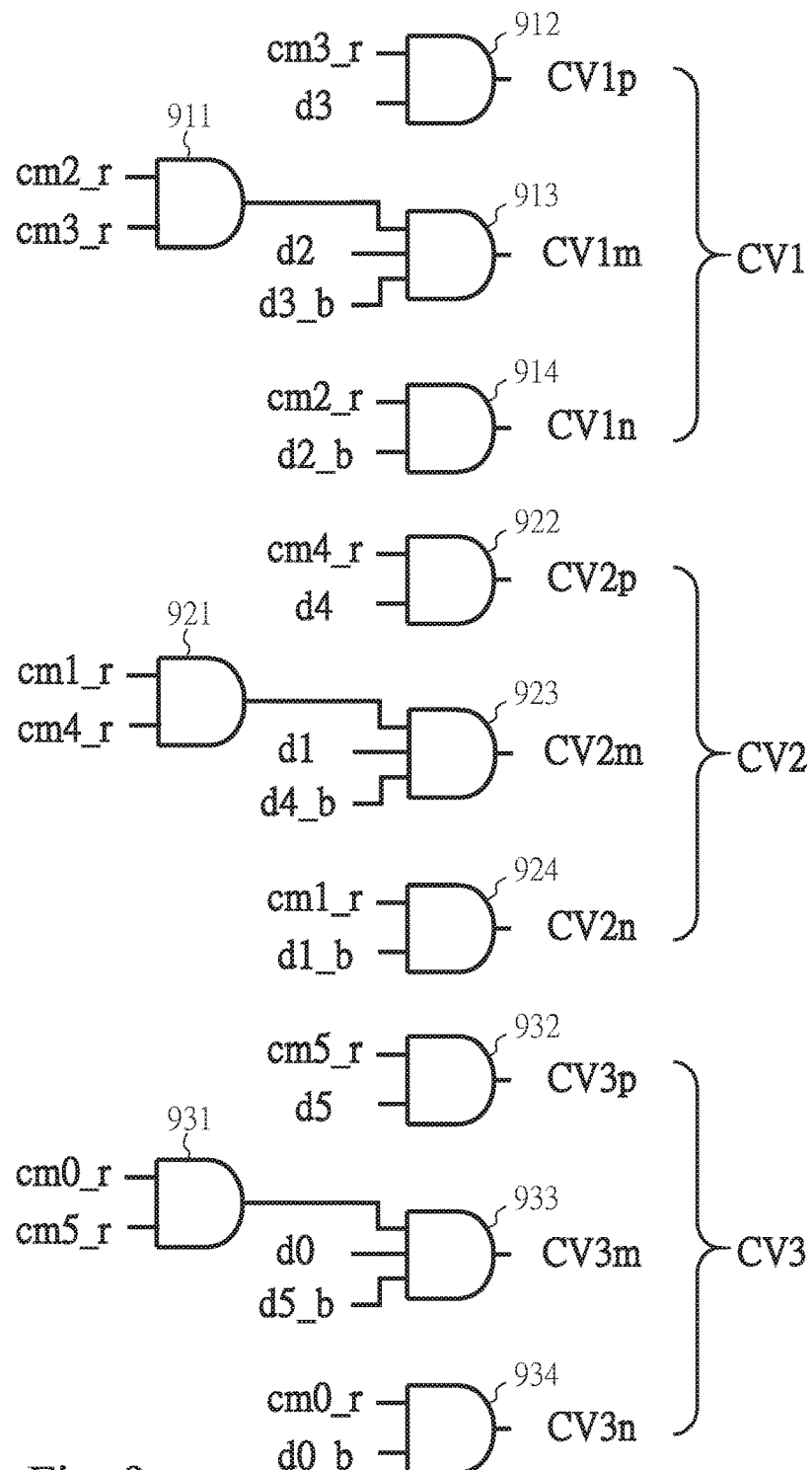
FIG. 9 illustrates an encoding circuit of a sub-ADC of an operation stage of a 2.5-bit pipelined ADC.

FIG. 9 shows an encoding circuit of a sub-ADC of an operation stage of a 2.5-bit pipelined ADC. A digital code outputted by the sub-ADC of a certain operation stage of the 2.5-bits includes three sub digital codes CV1 to CV3, and each sub digital code also contains three bits. The sub digital code CV1 (or CV2/CV3) is determined by the AND gates 911 to 914 (or 921 to 924/931 to 934) according to a part of the comparison results of the comparators 710 to 760 and a part of the comparison completion signals of the determination circuit. As shown in FIG. 9, since the bit CV1p is associated with the comparison result d3, the instruction signal indicating whether the bit CV1p has been determined is the comparison completion signal cm3_r, since the bit CV1m is associated with the comparison results d2 and d3_b, the indication signal indicating whether the bit CV1m has been determined is the intersection of the comparison completion signals cm2_r and cm3_r, since the bit CV1n is associated with the comparison result d2_b, the instruction signal indicating whether the bit CV1n has been determined is the comparison completion signal cm2_r. The operation details of the sub digital codes CV2 and CV3 are similar and shall thus be omitted for brevity. Note that the three bits of a sub digital code may not be determined at the same time. Take the sub digital code CV1 for example, the bit CV1p can be determined as soon as the comparator 730 completes the comparison. If the bit CV1p is logic 1, the two capacitors in the MDAC corresponding to the digital code CV1 (one of the two capacitors is coupled to the inverting input of the operational amplifier and the other to the non-inverting input of the operational amplifier) can then be coupled to a corresponding target voltage ($V_{ref}$ or $-V_{ref}$) at this time point, without needing to wait for the bits CV1m and CV1n to be determined, that is, without needing to wait for the comparator 740 to complete the comparison.

For an MDAC of a 2.5-bit pipelined ADC, four capacitors are coupled to each of the two inputs of the operational amplifier. One of the four capacitors serves as a feedback capacitor, while the other three capacitors have one of their respective two ends coupled to the input signal $V_{in}$ in the sampling phase. In the amplification phase, the target voltages to which the three capacitors couples through the ends that are coupled to the input signal $V_{in}$ in the sampling phase are respectively determined by the sub digital codes CV1 to CV3. The circuit of the MDAC for a 2.5-bit pipelined ADC is well known to those of ordinary skill in the art and the descriptions thereof shall be omitted herein for brevity. Similarly, except for feedback capacitors, other capacitors are coupled to the target voltages before the beginning of the amplification phase.

In accordance with the above-disclosed pipelined ADC, a method for operating a pipelined ADC is also disclosed.

Figure 10:
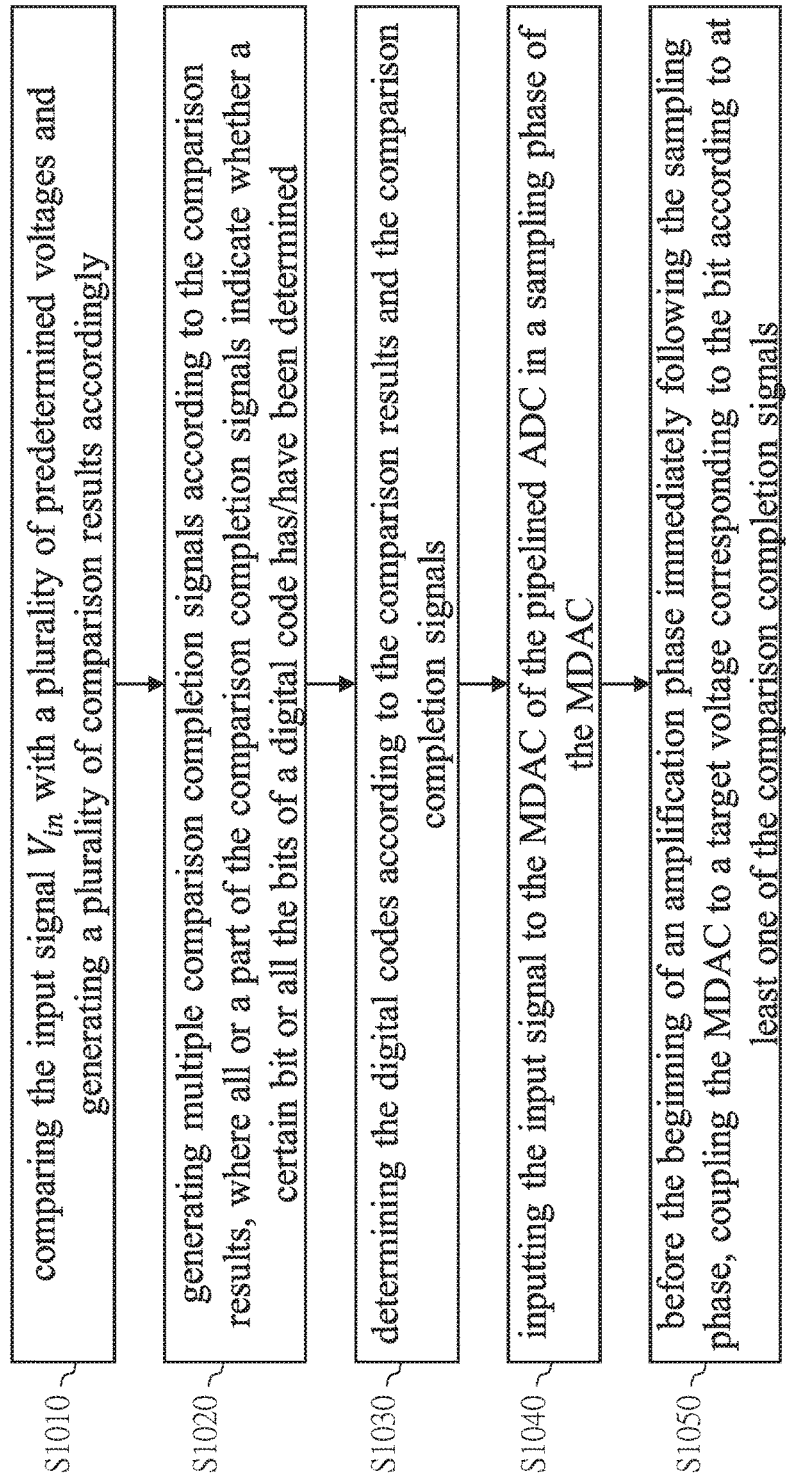
FIG. 10 illustrates a flow chart of a method for operating a pipelined ADC according to an embodiment of this disclosure.

FIG. 10 shows a flow chart of this method according to an embodiment of this disclosure. The method includes steps S1010 to S1050.

In step S1010, the input signal $V_{in}$ is compared with a plurality of predetermined voltages, and a plurality of comparison results are generated accordingly. For example, a 1.5-bit pipelined ADC uses the comparators 520 and 540 of FIG. 5 to perform this step, and a 2.5-bit pipelined ADC uses the comparators 710 to 760 of FIG. 7 to perform this step.

In step S1020, multiple comparison completion signals are generated according to the comparison results. All or a part of the comparison completion signals indicate whether a certain bit or all the bits of a digital code has/have been determined. For example, the 1.5-bit pipelined ADC uses the determination circuit 510 of FIG. 5 to perform this step, where the comparison completion signals cm0_r and cm1_r are generated according to all the comparison results, and the intersection of the comparison completion signals cm0_r and cm1_r indicates whether all the bits of the digital code CV have been determined. In another example, the 2.5-bit pipelined ADC uses the exclusive-OR (XOR) gates 810 to 860 of FIG. 8 to perform this step. The comparison completion signal cm0_r is generated according to the comparison results d0 and d0_b, and indicates whether the bit CV3n of the digital code has been determined.

In step S1030, the digital codes are determined according to the comparison results and the comparison completion signals. For example, a 1.5-bit pipelined ADC uses the encoding circuit 560 of FIG. 5 to perform this step, and a 2.5-bit pipelined ADC uses the AND gates 911 to 914, 921 to 924, and 931 to 934 to perform this step.

In step S1040, the input signal is inputted to the MDAC of the pipelined ADC in a sampling phase of the MDAC. In the sampling phase, the MDAC samples the input signal.

In step S1050, before the beginning of an amplification phase immediately following the sampling phase, the MDAC is coupled to a target voltage corresponding to the bit according to at least one of the comparison completion signals. For example, as shown in FIG. 6A, a logic level transition from logic 0 to logic 1 occurs to the comparison completion signals cm0_r and cm1_r at time point t3, meaning that the bits CVp, CVm and $CV_{in}$ all have been determined. At this time point, the MDAC is coupled to a corresponding target voltage $V_{ref}$, $-V_{ref}$ or $V_{cm}$ depending on the logic values of the bits CVp, CVm and CVn. As a result, the capacitors C1a and C1b are coupled to the target voltage in advance before the beginning of the amplification phase.

The above-mentioned 1.5-bit and 2.5-bit pipelined ADCs are for the purpose of explanation, not for limiting the scope of this disclosure. Those skilled in the art may apply the present disclosure to the pipelined ADCs with more bits. Moreover, although the above description uses differential signals as an example, this disclosure can also be applied to pipelined ADCs that deal with single-ended input signals.

Since people of ordinary skill in the art can appreciate the implementation detail and the modification thereto of the present method embodiment through the disclosure of the device embodiment, repeated and redundant description is thus omitted. Please note that there is no step sequence limitation for the method embodiments as long as the execution of each step is applicable. Furthermore, the shape, size, and ratio of any element and the step sequence of any flow chart in the disclosed figures are exemplary for understanding, not for limiting the scope of this disclosure.

The aforementioned descriptions represent merely the preferred embodiments of the present disclosure, without any intention to limit the scope of the present disclosure thereto. Various equivalent changes, alterations, or modifications based on the claims of the present disclosure are all consequently viewed as being embraced by the scope of the present disclosure.

What is claimed is:

1. A pipelined analog-to-digital converter (ADC) comprising a plurality of operation stages, one of which comprises:
   a multiplying digital-to-analog converter (MDAC) alternately operating in an amplification phase and a sampling phase in accordance with a first clock and a second clock that do not overlap, and performing subtraction and multiplication operations on an input signal according to a target voltage determined by a digital code in the amplification phase; and
   a sub-ADC, coupled to the MDAC, comprising:
      a plurality of comparators comparing the input signal with a plurality of predetermined voltages to generate a plurality of comparison results;
      a determination circuit, coupled to the comparators, generating a plurality of comparison completion signals according to the comparison results in a non-overlapping interval of the first clock and the second clock, wherein the comparison completion signals indicate whether the comparators have completed the comparison; and
      an encoding circuit, coupled to the comparators and the determination circuit, determining the digital code according to the comparison results and the comparison completion signals.

2. The pipelined ADC of claim 1, wherein the MDAC comprises a capacitor, and one end of the capacitor is coupled to the input signal in the sampling phase and coupled to the target voltage in the non-overlapping interval.

3. A pipelined analog-to-digital converter (ADC) comprising a plurality of operation stages, one of which comprises:
   a sub-ADC that converts an input signal into a digital code and generates a plurality of comparison completion signals, wherein all or a part of the comparison completion signals indicate whether a bit of the digit code has been determined; and
   a multiplying digital-to-analog converter (MDAC), coupled to the sub-ADC and alternately operating in an amplification phase and a sampling phase in accordance with a first clock and a second clock that do not overlap, comprising:
      an operational amplifier; and
      a capacitor, having a first end coupled to the operational amplifier and a second end coupled to the input signal, wherein in a non-overlapping interval of the first clock and the second clock, the second end is coupled to a target voltage corresponding to the bit according to at least one of the comparison completion signals.

4. The pipelined ADC of claim 3, wherein the target voltage is determined by the digital code.

5. The pipelined ADC of claim 3, wherein the sub-ADC comprises:
   a plurality of comparators comparing the input signal with a plurality of predetermined voltages to generate a plurality of comparison results;
   a determination circuit, coupled to the comparators, generating the comparison completion signals according to the comparison results; and an encoding circuit, coupled to the comparators and the determination circuit, determining the digital code according to the comparison results and the comparison completion signals.

6. A method for operating a pipelined analog-to-digital converter (ADC) comprising a plurality of operation stages, one of which comprises a multiplying digital-to-analog converter (MDAC) alternately operating in an amplification phase and a sampling phase, the method comprising:

comparing an input signal with a plurality of predetermined voltages to generate a plurality of comparison results;

generating a plurality of comparison completion signals according to the comparison results, wherein all or a part of the comparison completion signals indicate whether a bit of a digital code has been determined;

determining the digital code according to the comparison results and the comparison completion signals;

inputting the input signal to the MDAC in the sampling phase; and coupling the MDAC to a target voltage corresponding to the bit according to at least one of the comparison completion signals before the amplification phase that immediately follows the sampling phase starts.

7. The method of claim 6, wherein the MDAC comprises a capacitor, the step of inputting the input signal to the MDAC inputs the input signal to an end of the capacitor, and the step of coupling the MDAC to the target voltage corresponding to the bit according to at least one of the comparison completion signals couples the end of the capacitor to the target voltage.

8. The method of claim 6, wherein the amplification phase and the sampling phase are determined according to a first clock and a second clock that do not overlap, and the comparison completion signals are generated in a non-overlapping interval of the first clock and the second clock.

* * * * *